United States Patent [19]

Shigemitsu

[11] Patent Number: 4,563,242
[45] Date of Patent: Jan. 7, 1986

[54] METHOD FOR PLATING POLYAMIDE RESIN MOLDED ARTICLE

[75] Inventor: Hideyuki Shigemitsu, Ohtake, Japan

[73] Assignee: Mitsubishi Rayon Co., Ltd., Tokyo, Japan

[21] Appl. No.: 671,305

[22] Filed: Nov. 14, 1984

[30] Foreign Application Priority Data

Nov. 16, 1983 [JP]  Japan ................................. 58-215493

[51] Int. Cl.$^4$ .......................... B29C 17/08; B44C 1/22; C03C 15/00; C03C 25/06
[52] U.S. Cl. ................................. 156/651; 156/668; 252/79.2; 252/79.4; 427/307
[58] Field of Search ............... 156/651, 668; 252/79.1, 252/79.2, 79.4; 427/307; 204/32 R

[56] References Cited

U.S. PATENT DOCUMENTS 3,235,426  2/1966  Bruner ................................. 156/668
4,315,045  2/1982  Dillard et al. ....................... 427/307

Primary Examiner—William A. Powell
Attorney, Agent, or Firm—Cushman, Darby & Cushman

[57] ABSTRACT

A method for plating a polyamide resin molded article which comprises carrying out, before plating treatment, etching treatments, namely the first etching treatment with an aqueous stannic chloride solution and then the second etching treatment with an aqueous acid solution, and brings about a plating effect excellent in strength of adhesion of plating film and in plating appearance.

4 Claims, No Drawings

METHOD FOR PLATING POLYAMIDE RESIN MOLDED ARTICLE

TECHNICAL FIELD

The present invention relates to a method for plating a polyamide resin molded article.

PRIOR ART

Polyamide resins cannot be plated by the same system as the conventional plating treatment systems for ABS resins. They can be plated by using trichloroacetic acid, stannic chloride, hydrochloric acid, borohydrofluoric acid or the like as an etching solution, but no sufficiently satisfactory etching solution has not yet been obtained.

For example, when borohydrofluoric acid is used as an etching solution, the waste liquor is difficult to dispose.

Polyamide resins for plating are incorporated mainly with wollastonite as an inorganic filller, and when an aqueous acid solution such as hydrochloric acid or the like is used alone as an etching solution, not only the polyamide resin but also the wollastonite is etched, and hence the appearance of surface of the molded article tends to become like orange peel. Moreover, in this case, when etching treatment is conducted so that the strength of adhesion of plating film will sufficiently be exhibited, the unevenness of surface of the molded article becomes so serious that holes having a size larger than about 3 $\mu$ are formed, resulting in deterioration of the final plated molded article in appearance. Therefore, it is not advantageous.

Further, when an aqueous stannic chloride solution is used alone as an etching solution, the appearance of the plated molded article is good, but using it alone is disadvantageous in that the increase of strength of adhesion of plating film after plating treatment requires a long period of time, and that the molded article is lowered in hardness and tends to be injured with the increase of strength of adhesion of plating film. Still further, in the case of etching treatment with an aqueous stannic chloride solution alone, a tin layer remains in the surface layer of the molded article treated, and it is necessary to remove the tin layer by alkali treatment with an aqueous sodium hydroxide solution or the like. And dipping in an aqueous acid solution such as hydrochloric acid or the like is necessary for re-neutralizing the surface portion before attachment of a catalyst. Thus, the process is complicated.

OBJECT OF THE INVENTION

The object of this invention is to provide a method for plating a polyamide resin molded article by which a plated molded article of polyamide resin having fine unevennesses and excellent strength of adhesion of plating film and appearance can be produced by carrying out a two-stage etching treatment with specific etching solutions for substantially the same duration of treatment as in the case of single treatment with a conventional etching solution.

CONSTRUCTION OF THE INVENTION

This invention is a method for plating a polyamide resin molded article, characterized by carrying out, before plating treatment, etching treatments, namely, the first etching treatment with an aqueous stannic chloride solution and then the second etching treatment with an aqueous acid solution.

The polyamide resin constituting the polyamide resin molded article in this invention is a self-polycondensate of lactam, a polycondensate of diamine and dibasic acid, a self-polycondensate of $\omega$-amino acid or a copolymer thereof. Concrete examples of the polyamide resin include nylon 6, nylon 11, nylon 66, nylon 6-10 and nylon 6-66, etc. Although nylon 6 and nylon 66 are preferred from the viewpoint of heat-resistance, mechanical strength and stiffness, the polyamide resin is not critical. Further, in this invention, the polyamide resin includes also those incorporated with a minor amount of a rubber reinforced resin such as ionomer, polyester elastomer, ABS resin or the like for improving the impact resistance. Still further, it includes also those incorporated with an inorganic filler in an amount of 5 to 50% by weight based on the weight of the whole polyamide resin, and they are preferred from the viewpoint of stiffness.

The inorganic filler includes wollastonite, talc, glass fiber, carbon fiber, etc., which can be used alone or as a mixture thereof.

In conducting this invention, a desired molded article obtained by molding any of the above-mentioned polyamide resins by a conventional molding method is first degreased with an organic solvent such as methyl ethyl ketone or acetone, a surface active agent or the like. This degreasing treatment can be omitted if the surface of the molded article is clean. Thereafter, the molded article is washed with water and then subjected to the first etching treatment with an aqueous stannic chloride solution. After this first etching treatment, the molded article is washed with water and then subjected to the second etching treatment with an aqueous acid solution.

The concentration of the aqueous stannic chloride solution is 5 to 50% by weight, preferably 5 to 40% by weight in terms of stannic chloride.

The acid used for the second etching treatment includes inorganic acids such as hydrochloric acid, phosphoric acid, boric acid and the like and organic acids such as acetic acid, formic acid, oxalic acid and the like, and in particular, hydrochloric acid and acetic acid are preferably used. The concentration of the aqueous solution of the acid is 50% by weight or less, preferably 3 to 40% by weight.

Although the temperatures of the etching treatments are determined in consideration of the concentration of the etching solutions, they are generally 20° to 70° C. It is preferable from the viewpoint of controlling the process to adjust the temperatures of the etching treatments and the concentrations of the etching solutions so that the durations of the etching treatments are in the range of 5 to 30 minutes.

Next, as methods for attaching a catalyst to the above-mentioned molded article treated, there are a sensitizing-activating method and a catalyst-accelerator method.

The former, the sensitizing-activating method may either comprise first adsorbing a relatively strong reducing agent such as stannous chloride, hypophosphoric acid, hydragine chloride or the like on the surface of the molded article, and then dipping the molded article in a catalyst solution containing ions of a noble metal such as gold, silver, palladium or the like to deposit the noble metal as a catalyst on the surface of the molded article, or comprises first dipping the molded article in a catalyst solution containing the noble metal ions to adsorb the noble metal ions on the surface of the molded article, and then reducing the noble metal ions in a solution of the above-mentioned reducing agent to deposit the noble metal as a catalyst on the surface of the molded article.

The latter, the catalyst-accelerator method comprises dipping the molded article in a tin-palladium mixed catalyst solution, and then activating said catalyst solution with an acid such as hydrochloric acid, sulfuric acid or the like to deposit palladium as a catalyst on the surface of the molded article.

After a catalyst was attached to the surface of the molded articles subjected to the etching treatments by any of the above-mentioned methods, the molded article is subjected to plating treatments, i.e., electroless plating and then electroplating.

For the electroless plating, a well-known electroless plating bath comprising a metal salt, a reducing agent, a pH adjustor and the like can be used in general. As metals usable for the plating, copper, nickel, silver, tin, cobalt, alloys thereof and the like are used, though copper and nickel are used in general.

For the electroplating, there can be used metals such as copper, nickel, chromium and the like and a well-known electroplating bath which permits changing constituents of solution, additives and the thickness of plating film depending on purposes.

EXAMPLES

The present invention is concretely explained below referring to examples and comparative examples.

In the individual examples and comparative examples, the strength of adhesion of plating film was measured by peeling test, that is by depositing a copper electroplating layer having a thickness of about 40 $\mu$, cutting the plating film to a width of 2.5 cm, measuring the force necessary for perpendicularly peeling off the cut plating film, and calculating therefrom the force per a width of 1 cm.

And all parts and percents are by weight unless otherwise specified.

EXAMPLES 1 and 2

Flat plates were prepared by injection-molding each of the polyamide resins containing 30% of wollastonite shown in Table 1 and were formed into test samples.

In Table 1, the polyester elastomer is a polyester. polyether block copolymer in which the hard segment is composed of tetramethylene terephthalate units and the soft segment is composed of polytetramethylene glycol having an average molecular weight of about 1,200, the weight ratio of the hard segment to the soft segment being 75/25. The ABS resin is a copolymer of acrylonitrile, polybutadiene and styrene in the weight ratio of 11/61/28.

Each test sample was first subjected to an etching treatment with an aqueous stannic chloride solution having a concentration of 330 g/liter, at 30° C. for 5 minutes, washed with water, and then subjected to an etching treatment with 3N hydrochloric acid for 5 minutes. Thereafter, the test sample was washed with water and dipped in a catalyst solution ("Catalyst A-30", tradename, manufactured by OKUNO SEIYAKU KOGYO Co., Ltd. a composition containing palladium chloride, stannous chloride and hydrochloric acid as main component.) at 30° C. for 2 minutes to attach the catalyst to the test sample. Then, the test sample was washed with water and dipped in an accelerator solution containing 10% by volume of hydrochloric acid (a mixture of 1 part by volume of concentrated hydrochloric acid and 9 parts by volume of water: hereinafter the same applies) at 40° C. for 30 minutes. Next, the test sample was washed with water, dipped in 10% aqueous sodium hydroxide solution at room temperature for 1 minute, and then washed with water. Thereafter, the test sample was dipped in an electroless copper plating solution ("N-100" tradename, manufactured by OKUNO SEIYAKU KOGYO Co., Ltd. A composition containing formalin, copper sulfate and pH-adjustor, sodium hydroxide as main component.) at 30° C. for 10 minutes to perform an electroless copper plating. Subsequently, the test sample was plated in an electroplating copper solution comprising 200 g/liter of copper sulfate, 50 g/liter of sulfuric acid and 1 ml/liter of gloss agent ("Cupracid", tradename, manufactured by Schering Corp. Its component is not clear.) for 60 minutes at a liquid temperature of 20° C. and at a current density of $4A/dm^2$ to deposit thereon a copper plating layer having a thickness of about 40 $\mu$.

The thus obtained molded article subjected to the plating treatments was heat-treated for 1 hour in a hot air oven kept at 80° C., and then cooled to room temperature, after which the strengths of adhesion of the plating film after 24 hours and 720 hours were measured. The size of holes made by etching was also measured. Further, the appearance of the molded article subjected to the plating treatments was also evaluated. The results are shown in Table 1.

EXAMPLES 3 and 4

In Table 1 are also shown evaluation results for molded articles subjected to plating treatment in the same manner as in Examples 1 and 2, except that as to etching treatment conditions, there was carried out a two-stage etching treatment comprising etching with an aqueous stannic chloride solution having a concentration of 430 g/liter, at 30° C. for 4 minutes, and then etching with 3N hydrochloric acid for 3 minutes.

COMPARATIVE EXAMPLES 1 and 2

In Table 1 are also shown evaluation results for molded articles subjected to plating treatment in the same manner as in Examples 1 and 2, except that as to etching treatment conditions, a single etching treatment with an etching solution of 3N hydrochloric acid alone for 10 minutes was carried out.

COMPARATIVE EXAMPLES 3 and 4

In Table 1 are also shown evaluation results for molded articles subjected to plating treatment in the same manner as in Examples 1 and 2, except that as to etching treatment conditions, a single etching treatment with an aqueous stannic chloride solution having a concentration of 340 g/liter alone for 7 minutes was carried out.

TABLE 1

| | Resin composition | | | Content of resin in polyamide resin (%) | Wollastonite content of polyamide resin (%) | Size of hole formed by etching (μ) | Strength of adhesion of plating film (kg cm/cm) | | Appearance of molded article subjected to plating treatment |
|---|---|---|---|---|---|---|---|---|---|
| | Nylon 6 (Parts) | Polyester elastomer (Parts) | ABS resin (Parts) | | | | After 24 hrs. | After 720 hrs. | |
| Example 1 | 100 | 0 | 0 | 70 | 30 | About 1 | 1.3 | 1.5 | Good |
| Example 2 | 70 | 10 | 20 | " | " | " | 1.0 | 1.2 | " |
| Example 3 | 100 | 0 | 0 | " | " | " | 1.3 | 1.4 | " |
| Example 4 | 70 | 10 | 20 | " | " | " | 1.0 | 1.1 | " |
| Comparative Example 1 | 100 | 0 | 0 | " | " | About 3 | 1.2 | 1.5 | Bad |
| Comparative Example 2 | 70 | 10 | 20 | " | " | About 2 | 1.0 | 1.2 | " |
| Comparative Example 3 | 100 | 0 | 0 | " | " | About 1 | 0.3 | 1.0 | Good |
| Comparative Example 4 | 70 | 10 | 20 | " | " | " | " | 0.8 | " |

EFFECTS OF THE INVENTION

According to the plating method of this invention, the surface of a polyamide resin molded article is partly etched by the first etching treatment and the second etching treatment, so that fine unevennesses are formed in the surface of the molded article, and by virtue of an increase of the surface area and an anchor effect brought about by the fine unevennesses, a plated product excellent in strength of adhesion of plating film can be obtained. Moreover, according to the plating method of this invention, there can be obtained a plated product in which the size of hole formed by etching is about 1 μ and which is excellent in finished appearance of plating. Further, said plating method has the following excellent effect. Since an aqueous acid solution is used as the second etching solution, there is no thick swollen layer in the surface layer of the molded article unlike in the case of a conventional etching using an aqueous stannic chloride solution alone, a sufficient strength of adhesion of plating film is given shortly after plating treatment.

What is claimed is:

1. A method for plating a polyamide resin molded article which comprises carrying out, before plating treatment, etching treatments, comprising the first etching treatment with an aqueous stannic chloride solution and the second etching treatment with an aqueous acid solution.

2. A method according to claim 1, wherein the aqueous stannic chloride solution has a concentration of 5 to 40% by weight.

3. A method according to claim 1, wherein the acid used in the aqueous acid solution is hydrochloric acid or acetic acid.

4. A method according to claim 1 or 3, wherein the aqueous acid solution has a concentration of 3 to 40% by weight.

* * * * *